United States Patent
Iso et al.

(10) Patent No.: US 8,471,737 B2
(45) Date of Patent: Jun. 25, 2013

(54) SYSTEM AND METHOD FOR PROVIDING HIGH RESOLUTION DIGITAL-TO-ANALOG CONVERSION USING LOW RESOLUTION DIGITAL-TO-ANALOG CONVERTERS

(75) Inventors: Yoshimi Iso, Tokyo (JP); Akane Hiroshima, Tokyo (JP); Toshiya Tamaki, Tokyo (JP); Masashi Nishimoto, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 0 days.

(21) Appl. No.: 13/546,842

(22) Filed: Jul. 11, 2012

(65) Prior Publication Data

US 2013/0015989 A1    Jan. 17, 2013

(30) Foreign Application Priority Data

Jul. 13, 2011 (JP) .................................. 2011-154815

(51) Int. Cl.
*H03M 1/06* (2006.01)
(52) U.S. Cl.
USPC .......................................... 341/118; 341/144
(58) Field of Classification Search
USPC .................... 341/118, 144, 120, 145; 345/690
See application file for complete search history.

(56) References Cited

U.S. PATENT DOCUMENTS

| | | | |
|---|---|---|---|
| 4,835,535 A | 5/1989 | Shibayama et al. | |
| 2009/0273618 A1* | 11/2009 | Tsuchi | 345/690 |

FOREIGN PATENT DOCUMENTS

| | | |
|---|---|---|
| JP | S58-097918 A | 6/1983 |
| JP | S58-181323 A | 10/1983 |
| JP | 2000-278134 A | 10/2000 |
| JP | 2008-153928 A | 7/2008 |

* cited by examiner

*Primary Examiner* — Joseph Lauture
(74) *Attorney, Agent, or Firm* — Womble Carlyle

(57) ABSTRACT

DA conversion is performed while improving resolution and reducing the influence of errors. A predetermined weight is applied to an output of at least one of a plurality of DA converters to each of which calibration data is given; the resultant outputs are added by an adder. An output of the adder is converted to a digital value by an AD converter. If the predetermined weight has an error outside an allowable range on the basis of the obtained digital value, a calibrating process of obtaining a correction factor for correcting the digital signal to be converted so as to reduce influence of the error is controlled. When a digital signal is to be converted to an analog signal with high precision, the digital signal is corrected with the correction factor, the resultant value is supplied to the DA converters, and DA converted outputs are added by the adder.

29 Claims, 12 Drawing Sheets

CALIBRATION VALUE TO DAC1 AND DAC2

ADC MEASUREMENT VALUE
INPUT CALIBRATION VALUE TO DAC1

INPUT CALIBRATION VALUE TO DAC2

SYSTEM AND METHOD FOR PROVIDING HIGH RESOLUTION DIGITAL-TO-ANALOG CONVERSION USING LOW RESOLUTION DIGITAL-TO-ANALOG CONVERTERS

CROSS-REFERENCE TO RELATED APPLICATIONS

The disclosure of Japanese Patent Application No. 2011-154815 filed on Jul. 13, 2011 including the specification, drawings and abstract is incorporated herein by reference in its entirety.

FIELD OF THE INVENTION

The present invention relates to a digital-to-analog ("DA") conversion technique for improving DA conversion precision using a plurality of DA converting circuits and, for example, relates to a technique effectively applied to a microcomputer system having a sound reproducing function of DA converting pulse-code modulation ("PCM") data.

BACKGROUND OF THE INVENTION

There is a related technique of, using a plurality of DA converting circuits of low resolution such as eight bits provided in a microcomputer, realizing DA conversion of higher resolution.

Japanese Patent No. 2000-278134 discloses a technique for performing high-resolution DA conversion. According to this technique, a digital signal is divided into upper bits and lower bits, the upper bits and lower bits are each converted to analog signals by low-resolution DA converting circuits, and the analog signals are superimposed with one another as resultant signals of the DA conversion. In particular, the analog signals are superimposed with one another so that the upper bits and the lower bits are partly overlapped, thereby suppressing decrease in the analog signals at the time of carry of digit between the upper and lower bits.

Japanese Patent No. 2008-153928 discloses a system having a first DA converter dividing N bits of digital data into two channels: a first channel of (Na+Nc) bits from the most significant bits ("MSB") of the digital data and a second channel of (Nc+Nb) bits from the least significant bits ("LSB") of the digital data, where the first and second channels are coupled to one another, a second DA converter coupled to the second channel, an amplifier amplifying an output of the first DA converter, an adder adding an output of the amplifier and an output of the second DA converter, a subtractor subtracting an output of the second DA converter from an output of the amplifier, and DA conversion corrector that changes a full-scale output value of the second DA converter in accordance with an output of the subtractor, and a technique of realizing high-speed operation, high-resolution, and high-precision multi-bit DA conversion by combining the high-speed and low-cost DA converters of smaller bits.

Japanese Patent No. Sho 58 (1983)-97918 discloses a method of internally and automatically generating correction data for correcting a result of conversion of a DA converter of low resolution by DA converting the upper "i" bits of "n" bits of digital data by a first DA converter, storing error data in an output of the input data of the DA conversion, DA converting the error data in correspondence with the input data of the DA conversion by a second DA converter, further DA converting the lower "j" (which is equal to n−i) bits of the "n" bits of digital data by a third DA converter, combining outputs of the DA converters, comparing the combined data with the error data, and correcting a result of the DA conversion using a comparison result.

Japanese Patent No. Sho 58 (1983)-181323 discloses a system having a converter for converting upper bits of a digital input signal to an analog signal, a converter for converting lower bits of the digital input signal to an analog signal, a circuit alternately generating two arbitrary digital values and detecting the difference between two analog values of the two digital values, a circuit of calculating correction data from the detected difference, and a storage circuit storing the calculated correction data in association with the input digital signal, and a technique of realizing high-linearity DA conversion by correcting an error in an input digital signal to be converted on the basis of the stored correction data.

SUMMARY

In a technique of realizing high-resolution DA conversion by adding outputs of a plurality of low-resolution DA converters by an adder, the inventors of the present invention have examined correction of the influence of an error in a nominal resistance value of external resistive elements determining a resistance ratio at the time of determining a weight on a DA conversion value of lower bits for a DA conversion value of upper bits by the resistance ratio of the adder. From the viewpoint of the gist of the examination, in the patent documents, errors to be corrected are different and, further, error detecting methods and correcting methods are complicated.

An object of the present invention is to provide a data processing system capable of performing DA conversion with improved resolution and reduced influence of an error in a circuit characteristic by a relatively simple configuration. More specifically, an object of the invention is to provide a DA converting technique capable of simply and easily reducing the influence of an error or the like in a nominal resistance value of external resistive elements determining a resistance ratio of an adder which adds, while applying a weight at the resistance ratio, signals obtained by dividing a digital signal to be converted and DA converting the divided signals.

The above and other objects and novel features of the present invention will become apparent from the description of the specification and the appended drawings.

Outline of representative ones of inventions disclosed in the specification will be briefly described as follows.

A program control circuit using a plurality of DA converters, an adder adding an output of a first DA converter for a signal on a lower-order side to an output of a second DA converter for a signal on an upper-order side while applying a predetermined weight or gain according to a resistance ratio for maintaining the relation on the lower-order side to the upper-order side, and an AD converter controlling a calibration process of adding outputs of the DA converters to which calibration data is given by the adder, converting an output of the adder to a digital value by the AD converter and, when it is determined that the predetermined weight results in an error outside an allowable range on the basis of the converted digital value, obtaining a correction factor for correcting the digital signal to be converted so as to reduce influence of the error. At the time of converting a digital signal to be converted to an analog signal with high precision, the digital signal to be converted is corrected by using the correction factor. The resultant signal is supplied to the plurality of DA converters and outputs of the DA conversion are added by the adder.

Whether the weight according to the resistance ratio for maintaining the relation on the lower-order side to the upper-order has an error outside an allowable range or not can be determined by the process of adding results of DA conversion of calibration values by the adder. A correction factor for digital data to be converted can be easily obtained on the basis of the addition result.

Effects obtained by the representative one of the inventions disclosed in the specification will be described briefly as follows.

That is, with improved resolution and reduced influence of an error in a circuit characteristic realized by a relatively simple configuration, DA conversion can be performed. More specifically, the influence of an error or the like in a nominal resistance value of external resistive elements determining a resistance ratio of an adder which adds, while applying a weight at the resistance ratio, signals obtained by dividing a digital signal to be converted and DA converting the divided signals.

DETAILED DESCRIPTION

1. Outline of Embodiments

Figure 1:
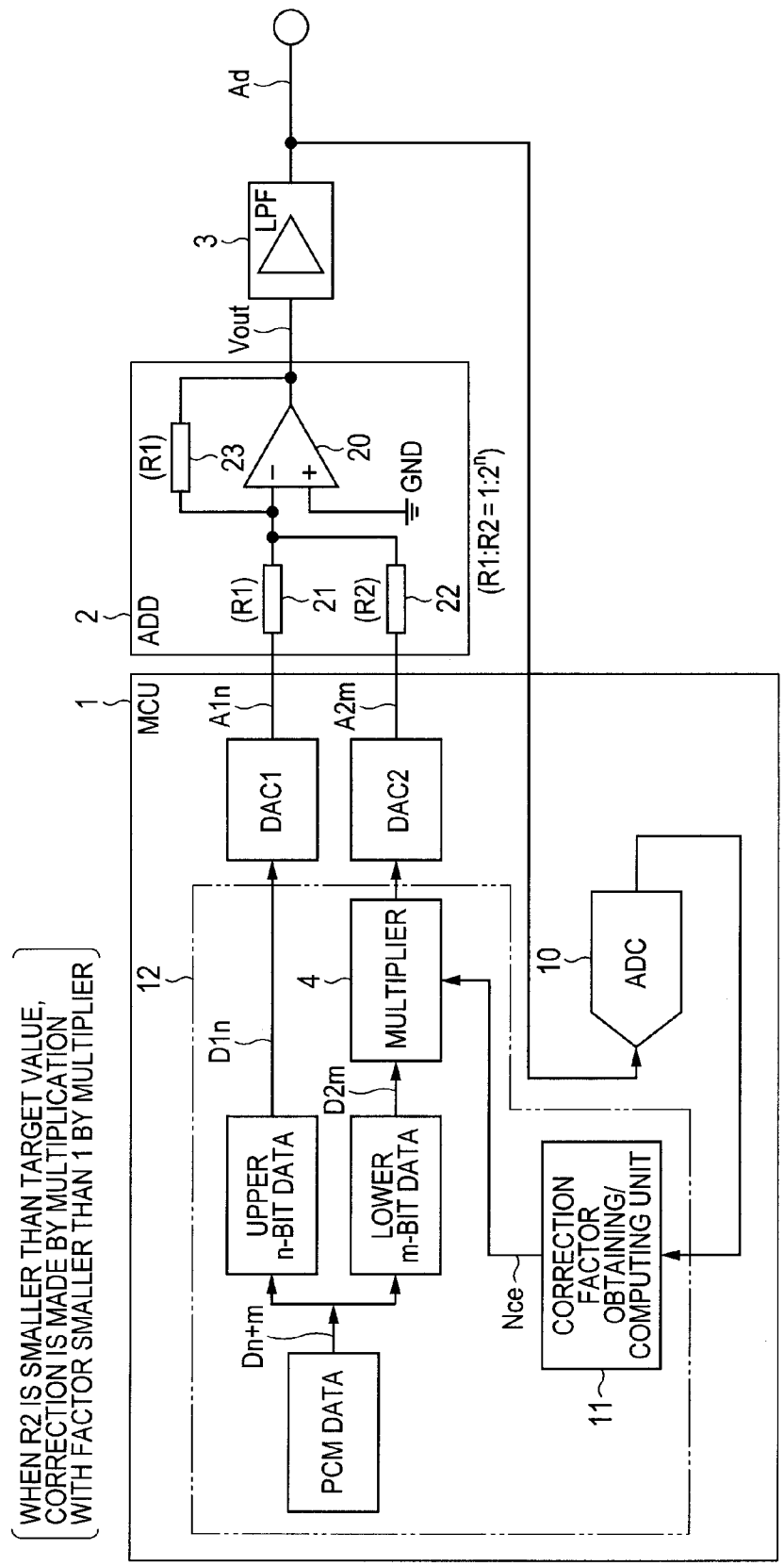
FIG. 1 is a block diagram showing a configuration as a DA converting function realized by a data processing system as an embodiment of the present invention, in the case where a resistance value R2 is smaller than an allowable range, of performing correction by multiplying lower m-bit data D2$m$ with a correction factor larger than 0 and smaller than 1 by a multiplier.

First, an outline of representative embodiments of the invention disclosed in the present application will be described. Reference numerals in the drawings referred to in parentheses in the description of the outline of the representative embodiments just illustrate the concept of components to which the reference numerals are designated.

[1] Calibrating Process for Obtaining a Correction Factor for a Signal to be Converted in High-Precision DA Conversion A data processing system as a representative embodiment of the present invention has: a plurality of DA converters (DAC1, DAC2) each converting an input signal to an analog signal; an adder (2) adding an output of the DA converter for a low-order signal to an output of the DA converter for a high-order signal with a predetermined weight according to resistance ratio for maintaining the relation on the low-order side to the high-order side; an AD converter (10) converting an input signal to a digital signal whose number of bits is larger than the number of conversion bits of the DA converters; and a program control circuit (12) executing an instruction to perform a data process. The program control circuit controls a calibrating process and a high-precision DA converting process as the data process. The calibrating process is a process of adding outputs of the plurality of DA converters to each of which calibration data is given by the adder, converting an output of the adder to a digital value by the AD converter, determining whether the predetermined weight has an error outside an allowable range or not on the basis of the converted digital value and, when it is determined that there is an error outside the allowable range, obtaining a correction factor for correcting the digital signal to be converted so as to reduce influence of the error. The high-precision DA converting process is a process of correcting a digital signal to be converted with the correction factor, giving the resultant values to the plurality of DA converters, adding DA converted outputs by the adder, and thereby generating an analog signal for the digital signal to be converted.

By the above, whether or not a weight according to the resistance ratio for maintaining the relation on the low-order side to the high-order side has an error outside the allowable range can be determined by the process of adding result of DA conversion of calibration values by the adder. Accordingly, a correction factor for digital data to be converted can be easily obtained. Therefore, with improved resolution and reduced influence of an error in a circuit characteristic realized by the relatively simple configuration, DA conversion can be performed. More specifically, the influence of an error in a nominal resistance value of external resistive elements determining a resistance ratio of the adder which adds, while applying a weight at the resistance ratio, signals obtained by dividing a digital signal to be converted and DA converting the divided signals can be easily reduced.

[2] Addition of Low-Order Signal with Weight of ½$^n$ to Signal of Upper N Bits

The data processing system of [1] has, as the plurality of DA converters, first and second DA converters. The first DA converter receives a high-order signal of n bits, and the second DA converter receives a low-order signal. The adder has an amplification circuit (20) and a plurality of resistive elements (21, 22, 23) having a nominal resistance value for adding a low-order signal with a weight of ½$^n$ to a high-order signal of n bits and coupled to the amplification circuit.

With the configuration, the relation of the low-order signal to the high-order signal of n bits can be easily reflected in an output of the adder.

[3] Inverting Adder

In the data processing system, the adder is an inverting adder using a differential amplifier. To an inversion input terminal of the differential amplifier, an output of the first DA converter is coupled via a resistive element (21) having a first nominal resistance value (R1) and an output of the second DA converter is coupled via a resistive element (22) having a second nominal resistance value (R2). An output terminal of the differential amplifier is feedback-coupled to the inversion input terminal via a resistive element (23) having the first nominal resistance value (R1). The second nominal resistance value is $2^n$ times as large as the first nominal resistance value.

With the configuration, the adder can be easily realized by the circuit form of the inverting adder.

[4] Determination of Error in Resistance Ratio

In the data processing system of [3], the program control circuit performs first to third processes in the calibration process. The first process (S11, S12) is a process of supplying a calibration value to the first DA converter, supplying value "0" to the second DA converter, and converting a signal obtained from the adder by the AD converter to obtain a first addition value. The second process (S13, S14) is a process of supplying value "0" to the first DA converter, supplying the calibration value to the second DA converter, and converting a signal obtained from the adder by the AD converter to obtain a second addition value. The third process (S15) is a process of determining whether or not the resistance ratio has an error outside an allowable range on the basis of the difference between the ratio of the second addition value to the first addition value and ½$^n$ and obtaining a necessary correction factor.

In such a manner, whether the resistance ratio of the adder has an error outside an allowable range or not can be determined by the simple process steps.

[5] Correction Factor of Value 1

In the data processing system of any of [1] to [4], the program control circuit sets "1" as the value of the correction factor in the case where the resistance ratio does not have an error outside an allowable range in the calibrating process.

Since the value of the correction factor is "1" also in the case where there is no error, even when digital data to be converted is multiplied with the correction factor, there is no influence. Regardless of whether the resistance ratio has an error outside the allowable range or not, the correcting process step using the correction factor can be commonly performed in the high-precision AD converting process.

[6] Correction Flag

In the data processing system in any of [1] to [5], the program control circuit holds, together with the correction factor, a correction flag in which a result of determination of whether or not the resistance ratio has an error outside an allowable range is reflected in the calibrating process. In the high-precision DA converting process, when the correction flag indicates that the resistance ratio does not have the error outside the allowable range, the program control circuit supplies a digital signal to be converted to a plurality of DA converters without performing correction with the correction factor.

In such a manner, in the case where the resistance ratio does not have an error outside the allowable range, a substantially unnecessary correcting process can be omitted in the high-precision AD converting process.

[7] Nonvolatile memory

The data processing system according to any of [1] to [6] further includes a nonvolatile storage (45) which can electrically rewrite the correction factor on the basis of control of the program control circuit.

With the configuration, a correction factor which is obtained once can be maintained also at the time of power shutdown.

[8] Microcomputer

In the data processing system in any of [1] to [7], the DA converter, the AD converter, and the program control circuit are included in a one-chip microcomputer (1).

With the configuration, using DA converters of low resolution in the microcomputer, high-precision DA conversion of high resolution can be realized.

[9] Reconfigurable Analog Circuit

In the data processing system of [8], the adder includes a reconfigurable analog circuit (8) in which an analog circuit function can be reconfigured by control data which is given on the basis of control of the program control circuit, and a plurality of external resistive elements (80, 81, and 82) for generating the resistance ratio.

With the configuration, the adder necessary for high-precision DA conversion of high resolution using the DA converters of low resolution in the microcomputer can be easily realized by the reconfigurable analog circuit. In the reconfigurable analog circuit, a number of selection circuits and selection switches are disposed to make the analog circuit function reconfigurable on the basis of the control data, and a relatively large resistance component is parasitic in the signal path. Such a parasitic resistance component causes an error in a weight of the adder which is set by the plurality of resistive elements and exerts an influence. The influence of such an error component can be also reduced by obtaining a correction factor by the calibration process.

[10] SIP

In the data processing system of [9], the reconfigurable analog circuit is configured by a one-chip semiconductor integrated circuit, and the reconfigurable analog circuit and the microcomputer are sealed in a single package in a system-in-package form (101).

Even when the reconfigurable analog circuit and the microcomputer are provided in multiple chips, by making them in a system-in-package form, handling of the data processing system becomes easier.

[11] One Chip

In the data processing system of [9], the reconfigurable analog circuit and the microcomputer are formed on the same chip.

With the configuration, the data processing system is realized in the system-on-chip form, and it can contribute to increase in the speed of operation and reduction in power consumption.

[12] CPU

In the data processing system of any of [1] to [11], the program control circuit has a central processing unit (41) and a program memory (42) storing a program to be executed by the central processing unit.

With the configuration, the program control circuit can be easily realized.

[13] PCM Data

In the data processing system of [12], the digital data to be converted is PCM data.

Consequently, improvement in reproduction sound quality using PCM data of an electronic device can be realized at low cost.

[14] System 1: Correction Factor Having Value of 0 to 1 to be Multiplied to the Low-Order Signal in the Case where Weight is Larger than $\frac{1}{2}^n$ In the data processing system of [2], in the calibrating process, in the case where the weight according to the plurality of resistive elements is larger than $\frac{1}{2}^n$ and outside the allowable range, the program control circuit sets, as the correction factor, a value which is larger than 0 and smaller than 1 and is to be multiplied to the low-order signal (FIG. 1).

In the case where the resistive element which receives an output of the second DA converter becomes smaller than a target and the weight according to the resistive element becomes larger than $\frac{1}{2}^n$, an output of the adder becomes too large. Consequently, by multiplying the low-order signal which is supplied to the second DA converter with the correction factor smaller than 1 and making a correction, the influence of an error in the weight can be reduced.

Figure 2:
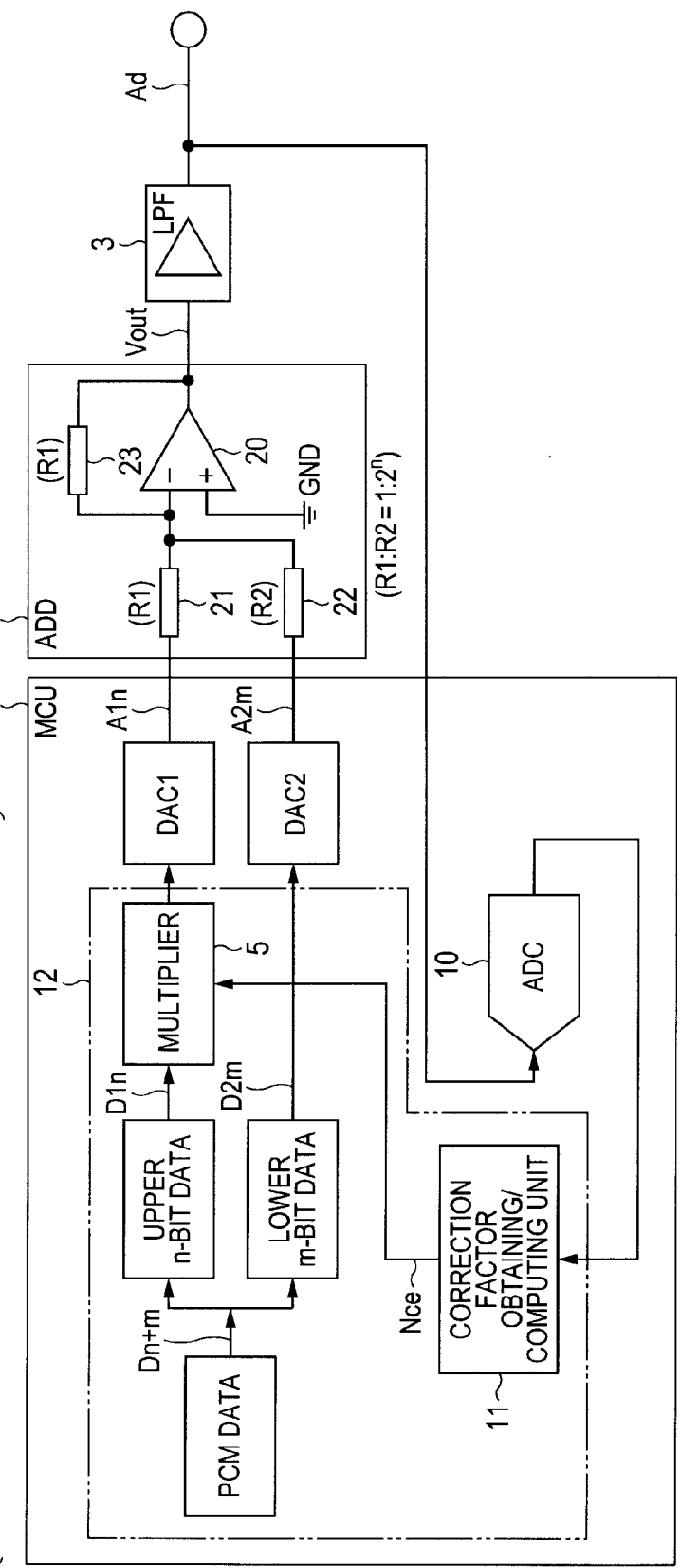
FIG. 2 is a block diagram showing a configuration as a DA converting function realized by a data processing system as an embodiment of the present invention in which, in the case where the resistance value R2 is larger than an allowable range, if lower m-bit data D2$m$ is multiplied with a correction factor larger than 1, digit overflow occurs, so that correction is made by multiplying upper n-bit data D1$n$ with a correction factor larger than 0 and smaller than 1 by a multiplier.

[15] System 2: Correction Factor Having Value of 0 to 1 to be Multiplied to the High-Order Signal in the Case Where Weight is Smaller than $\frac{1}{2}^n$ In the data processing system of [2], in the calibrating process, in the case where the weight according to the plurality of resistive elements is smaller than $\frac{1}{2}^n$ and outside the allowable range, the program control circuit sets, as the correction factor, a value which is larger than 0 and smaller than 1 and is to be multiplied to the high-order signal (FIG. 2).

In the case where the resistive element which receives an output of the second DA converter becomes larger than a target and the weight according to the resistive element becomes smaller than $\frac{1}{2}^n$, an output of the adder becomes too small. If correction is made by multiplying the low-order signal which is supplied to the second DA converter with the correction factor larger than 1, digit overflow occurs in the second DA converter. Consequently, by making a correction by multiplying a high-order signal which is input to the first DA converter with a correction factor smaller than 1, the influence of an error in the weight can be reduced without causing digit overflow in the DA converter.

[16] System 3: when Weight is Smaller than $\frac{1}{2}^n$, Low-Order Signal is Shifted by One Bit Toward Low-Order Direction and Multiplied with Correction Factor Larger than 1

Figure 3:
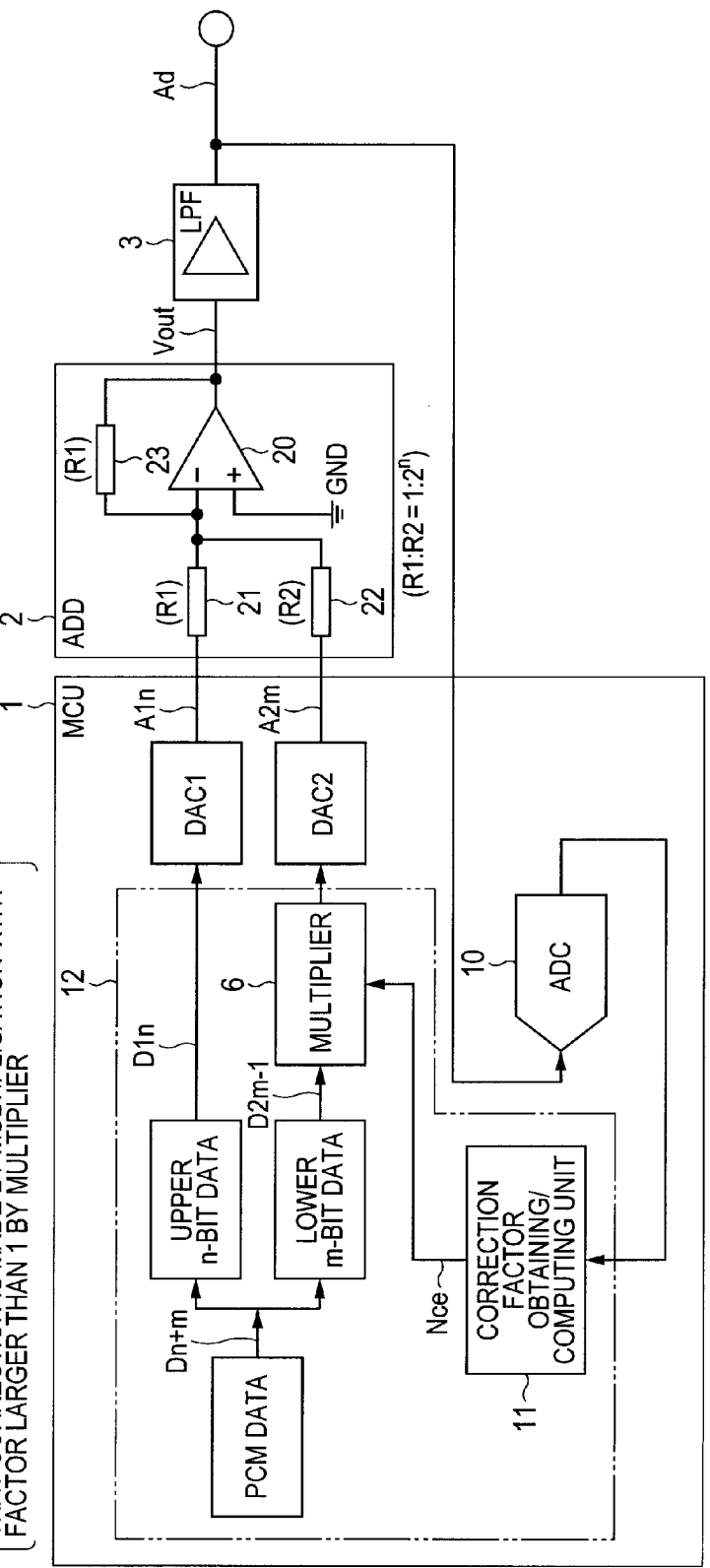
FIG. 3 is a block diagram showing a configuration as a DA converting function realized by a data processing system as an embodiment of the present invention in which, in place of lower m-bit data D2$m$, lower-bit data D2$m$−1 obtained by shifting the data D2$m$ by one bit to the low-order side is prepared so that a correction factor larger than 1 can be used for multiplication, and the lower-bit data D2$m$−1 is multiplied with the correction factor larger than 1 by a multiplier.

In the data processing system of [2], in the calibrating process, in the case where the weight according to the plurality of resistive elements is larger than $\frac{1}{2}^n$ and outside the allowable range, the program control circuit shifts the low-order signal by one bit toward a low-order direction and makes the correction factor a value which is larger than 1 and is to be multiplied to the shifted signal (FIG. 3).

In the case where the resistive element which receives an output of the second DA converter becomes larger than a target and the weight according to the resistive element becomes smaller than $\frac{1}{2}^n$, an output of the adder becomes too small. By shifting the low-order signal which is input to the second DA converter by one bit toward the low-order direction, even when correction is made by multiplying the low-order signal which is supplied to the second DA converter with the correction factor larger than 1, occurrence of digit overflow can be prevented. However, the number of bits of a result of DA conversion obtained from the adder becomes smaller than that in the case of [14] and [15] by one bit.

[17] System 4: when Weight is Smaller than $\frac{1}{2}^n$, Low-Order Signal Obtained by Increasing The Number of Bits of High-Order Signal by One Bit and Splitting the Signal is Shifted by One Bit Toward Low-Order Direction and Multiplied with Correction Factor Larger than 1 (R2 is Large)

Figure 4:
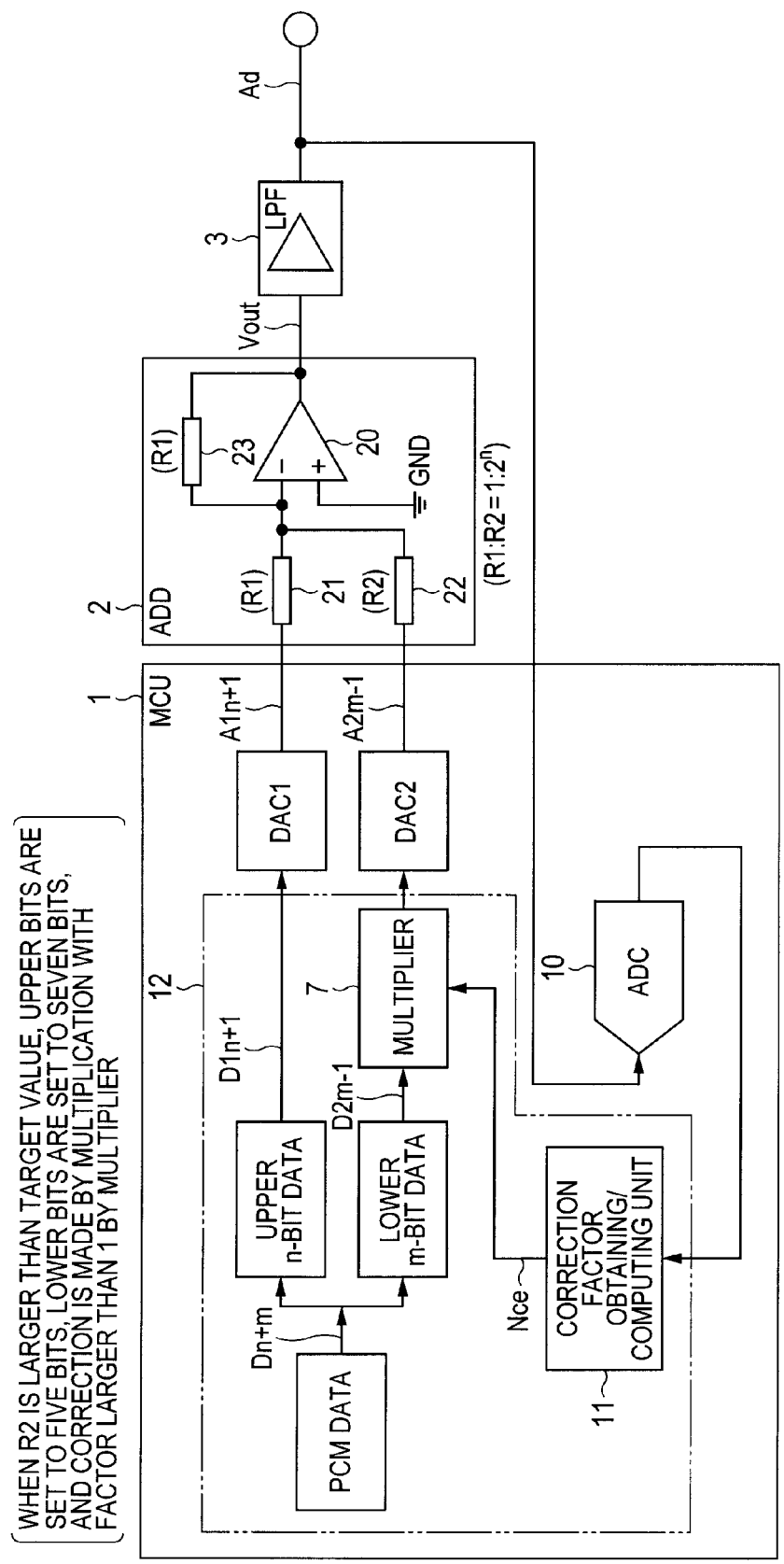
FIG. 4 is a block diagram showing a configuration as a DA converting function realized by a data processing system as an embodiment of the present invention, of increasing upper-bit data by one bit to obtain data D1$n$+1 of n+1 bits, setting data D2$m$−1 of m−1 bits as lower-bit data, and performing multiplication with a correction factor larger than 1 by a multiplier.

In the data processing system of [2], in the calibrating process, in the case where the weight according to the plurality of resistive elements is larger than $\frac{1}{2}^n$ and outside the allowable range, the program control circuit increases the number of bits of the high-order signal by one bit and decreases the number of bits of the low-order signal by one bit and makes the correction factor a value which is larger than 1 and is to be multiplied to the low-order signal (FIG. 4).

By increasing the number of bits of the high-order signal which is supplied to the first DA converter by one bit and decreasing the number of bits of the low-order signal which is supplied to the second DA converter by one bit, even when a correction is made by multiplying the low-order signal with a correction factor larger than 1, an AD conversion result free from digit underflow and digit overflow can be obtained.

Detailed Embodiments

First Embodiment

FIG. 1 illustrates a DA converting function realized by a data processing system as an embodiment of the present invention. The DA converting function shown in the diagram is a function of converting a digital signal having N bits, where N is greater than the individual resolution of any of DA converters DAC1 and DAC2 as on-chip elements of a microcomputer (MCU) 1 by using the plurality of DA converters DAC1 and DAC2. For example, a basic configuration is that PCM data Dn+m (comprised of n+m bits) to be subjected to digital process in the microcomputer (MCU) 1 is divided into upper n-bit data D1$n$ and lower m-bit data D2$m$, the data D1$n$ and D2$m$ are converted to analog signals A1$n$ and A2$m$ by using the DA converters DAC1 and DAC2, respectively, and the analog signals A1$n$ and A2$m$ are added by an adder (ADD) 2 to generate a sound signal Ad via a low-pass filter 3.

The adder 2 adds the analog signal A2$m$ to the analog signal A1$n$ with a predetermined weight according to the resistance ratio for maintaining the relation on the low-order side to the high-order side. That is, the analog signal A2$m$ converted from the lower m-bit data D2$m$ by the DA converter DAC2 is weighted so as to become a signal value in unit of resolution of the DA converter DAC1 for the upper n-bit data D1$n$, and the weight of $\frac{1}{2}^n$ has to be applied to the analog signal A2$m$ for the analog signal A1$n$. Although not limited, in the case of configuring the adder 2 by an inverting adder using an operation amplifier 20 as shown in the diagram, when the resistance value of an input resistive element 21 of an inversion input terminal (−) is R1, the resistance value of an input resistive element 22 of a non-inversion input terminal (+) is R2, and the resistance value of a feedback resistive element 23 is R1, an output voltage Vout of the adder 2 satisfies the equation Vout= (A1$n$/R1+A2$m$/R2)R1Vout=A1$n$+R1/R2×A2$m$. Therefore, the resistance ratio R1/R2 has to be equal to $\frac{1}{2}^n$. For example, when n=4 and m=8, R1=1 kΩ and R2=16 kΩ.

The resistance values R1 and R2 have an error, further, a not-desired parasitic resistance component and the like exist in a signal node of the adder 2, and the case where the resistance ratio R1/R2 as a target has an error outside an allowable range is assumed. To suppress the influence of the error, a correction factor is computed by using an AD converter ADC 10 and a correction factor obtaining/computing unit 11. For example, in the case where the resistance value R2 is smaller than the allowable range, an output of the adder 2 becomes larger than an expected value. It is consequently sufficient to make a correction by multiplying the lower m-bit data D2m with a correction factor larger than 0 and smaller than 1 by a multiplier 4 as shown in FIG. 1.

When the resistance value R2 is larger than the allowable range, an output of the adder 2 becomes smaller than an expected value. When the lower m-bit data D2m is multiplied with a correction factor larger than 1, digit overflow occurs, and conversion precision deteriorates. In this case, as shown in FIG. 2, it is sufficient to make a correction by multiplying the upper n-bit data D1n with a correction factor larger than 0 and smaller than 1 by a multiplier 5.

In this case, in place of FIG. 2, to address the situation by multiplication on the lower m-bit side, as shown in FIG. 3, to make a correction factor larger than 1 multiplied, in place of the lower m-bit data D2m, lower-order data D2m−1 obtained by shifting the lower m-bit data D2m by one bit in a lower-bit direction is prepared. It is sufficient to multiply the low-order data D2m−1 with a correction factor larger than 1 by a multiplier 6.

In the case of FIG. 3, PCM data to be DA converted becomes substantially 11 bits. To recover the precision of DA conversion to 12 bits, as illustrated in FIG. 4, the upper-order data is increased by one bit to obtain data D1n+1 of n+1 bits, and data D2m−1 of m−1 bits is used as low-order data and multiplied with a correction factor larger than 1 by a multiplier 7.

The process of performing DA conversion by multiplication with a correction factor shown in any of FIGS. 1 to 4 is called high-precision DA converting process for the reason that a digital signal having the number of bits larger than resolution of the DA converters DAC1 and DAC2 is DA converted by using the plurality of DA converters DAC1 and DAC2.

Next, calibrating process of obtaining the correction factor will be described. To perform the calibrating process, as shown in FIGS. 1 to 4, the microcomputer 1 has the AD converter 10 and the correction factor obtaining/computing unit 11. The AD converter 10 has resolution higher than that of the DA converters DAC1 and DAC2. The multipliers 4, 5, 6, and 7 and the correction factor obtaining/computing unit 11 are realized by a program control circuit 12 mounted the microcomputer 1. The program control circuit 12 is configured by, for example, a central processing unit, a program memory storing a program executed by the central processing unit, an accelerator for reducing the operation process load of the central processing unit, and the like. The computation by the multipliers 4, 5, 6, and 7 and the correction factor obtaining/computing unit 11 is specified according to the program executed by the central processing unit.

The program control circuit 12 gives necessary data to the DA converters DAC1 and DAC2 without performing multiplication in the multipliers 4, 5, 6, and 7 in the calibrating process.

In the calibrating process, the program control circuit 12 first gives a calibration value Dcb to the DA converter DAC1, gives the value 0 to the DA converter DAC2, adds the values in the adder 2, and takes an output signal of the adder 2 into the AD converter 10 via the low-pass filter 3. The AD converter ADC AD-converts the amplitude of the output signal of the adder 2 to obtain a first measurement value Dms1.

Subsequently, the program control circuit 12 gives the calibration value Dcb to the DA converter DAC2, gives the value 0 to the DA converter DAC1, adds the values in the adder 2, and takes an output signal of the adder 2 into the AD converter 10 via the low-pass filter 3. The AD converter ADC AD-converts the amplitude of the output signal of the adder 2 and obtains a second measurement value Dms2.

Figure 5A:
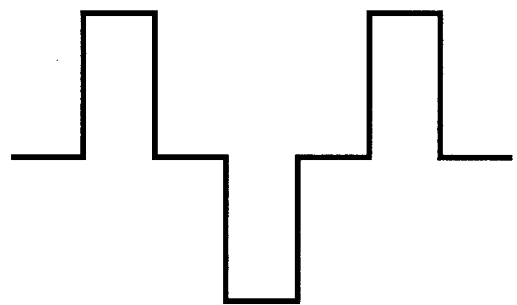
FIGS. 5A to 5C are waveform diagrams illustrating calibration values supplied to DACs and measurement values of an ADC.
Figure 5B:
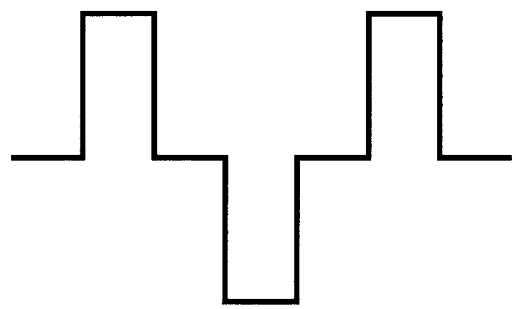
Figure 5C:

For example, when the calibration value Dcb given to the DA converters DAC1 and DAC2 is as shown in FIG. 5A, an output of the AD converter 10 when the calibration value is given to the DA converter DAC1 is as shown in FIG. 5B, and an output of the AD converter 10 when the calibration value is given to the DA converter DAC2 is as shown in FIG. 5C.

In the configuration of the adder 2, the first measurement value Dms1 corresponds to the calibration value Dcb, and the second measurement value Dms2 is a signal which is R/1/R2 times as large as the calibration value Dcb. That is, Dms2/Dms1=R1/R2. In the examples of FIGS. 1 to 4, when there is no error in the resistance values R1 and R2, Dms2/Dms1=R1/R2=$\frac{1}{2}^n$. The correction factor obtaining/computing unit 11 determines whether there is an error outside the allowable range or not in the resistance ratio R1/R2 on the basis of the ratio between the first measurement value Dms1 and the second measurement value Dms2 and obtains a correction factor to reduce the error in accordance with the value of the error.

A correction factor according to the value of the error may be selected from a prepared lookup table. Alternatively, while computing a correction factor each time, the calibration process is repeated a plurality of times until the error becomes gradually small to obtain a final correction factor. The obtained correction factor Nce is supplied to the multipliers 4, 5, 6, or 7 in high-precision DA converting process and provided for multiplication. Desirably, the correction factor Nce obtained once is stored, for example, in a nonvolatile memory so that it can be reused even if power shutdown occurs. In the case of using a lookup table, selected data may be stored in the nonvolatile memory.

According to the first embodiment, the following effects are obtained.

(1) Whether a weight according to the resistance ratio R1/R2 for maintaining the relation on the low-order side to the high-order side has an error outside an allowable range or not can be determined by the process of adding the DA conversion result of the calibration value Dcb by the adder. Accordingly, the correction factor Nce for the digital data Dn+m to be converted can be easily obtained. Therefore, with a relatively simple configuration, with improved resolution and reduced influence of an error in the circuit characteristic of the adder 2, the DA conversion can be performed. More specifically, the influence of an error in the nominal resistance values R1, R2, and R1 of the external resistive elements 21, 22, and 23 determining the resistance ratio R1/R2 of the adder 2 which adds a weight according to the resistance ratio R1/R2 to a result of DA conversion performed on a digital signal to be converted which is divided can be simply and easily reduced.

(2) As illustrated in FIG. 1, in the calibrating process, when the weight according to the plurality of resistive elements 21, 22, and 23 is larger than $\frac{1}{2}^n$ and outside the allowable range, the correction factor Nce is set to a value which is larger than 0 and smaller than 1 and is to be multiplied to the low-order signal D2m that is input to the DA converter DAC2. By making a correction by multiplying the low-order signal D2m with the correction factor Nce smaller than 1, the influence of the error in the weight can be reduced.

(3) As illustrated in FIG. 2, in the calibrating process, when the weight according to the plurality of resistive elements 21, 22, and 23 is smaller than $\frac{1}{2}^n$ and outside the allowable range, by setting the correction factor Nce to a value which is larger than 0 and smaller than 1 and is to be multiplied to the high-order signal D1n, without causing digit overflow in the DA converter DAC2, the influence of the error in the weight can be reduced.

(4) As illustrated in FIG. 3, in the calibrating process, in the case where the weight according to the plurality of resistive elements 21, 22, and 23 is larger than ½" and outside the allowable range, by shifting the low-order signal by one bit toward the low-order direction and setting the correction factor Nce to a value which is larger than 1 and multiplied to the shifted signal Dm2−1, even when correction is made by multiplying the low-order signal D2m−1 which is supplied to the DA converter DAC2 with the correction factor larger than 1, occurrence of digit overflow can be prevented.

(5) As illustrated in FIG. 4, in the calibrating process, in the case where the weight according to the plurality of resistive elements 21, 22, and 23 is larger than ½" and outside the allowable range, by setting the correction factor Nce to a value which is larger than 1 and multiplied to the low-order signal D2m−1 by increasing the number of bits of the high-order signal by one bit (D1n+1) and decreasing the number of bits of the low-order signal by one bit (D2m−1), even when a correction is made by multiplying the low-order signal with the correction factor larger than 1, an AD conversion result free from digit underflow and digit overflow can be obtained.

Second Embodiment

Figure 6:
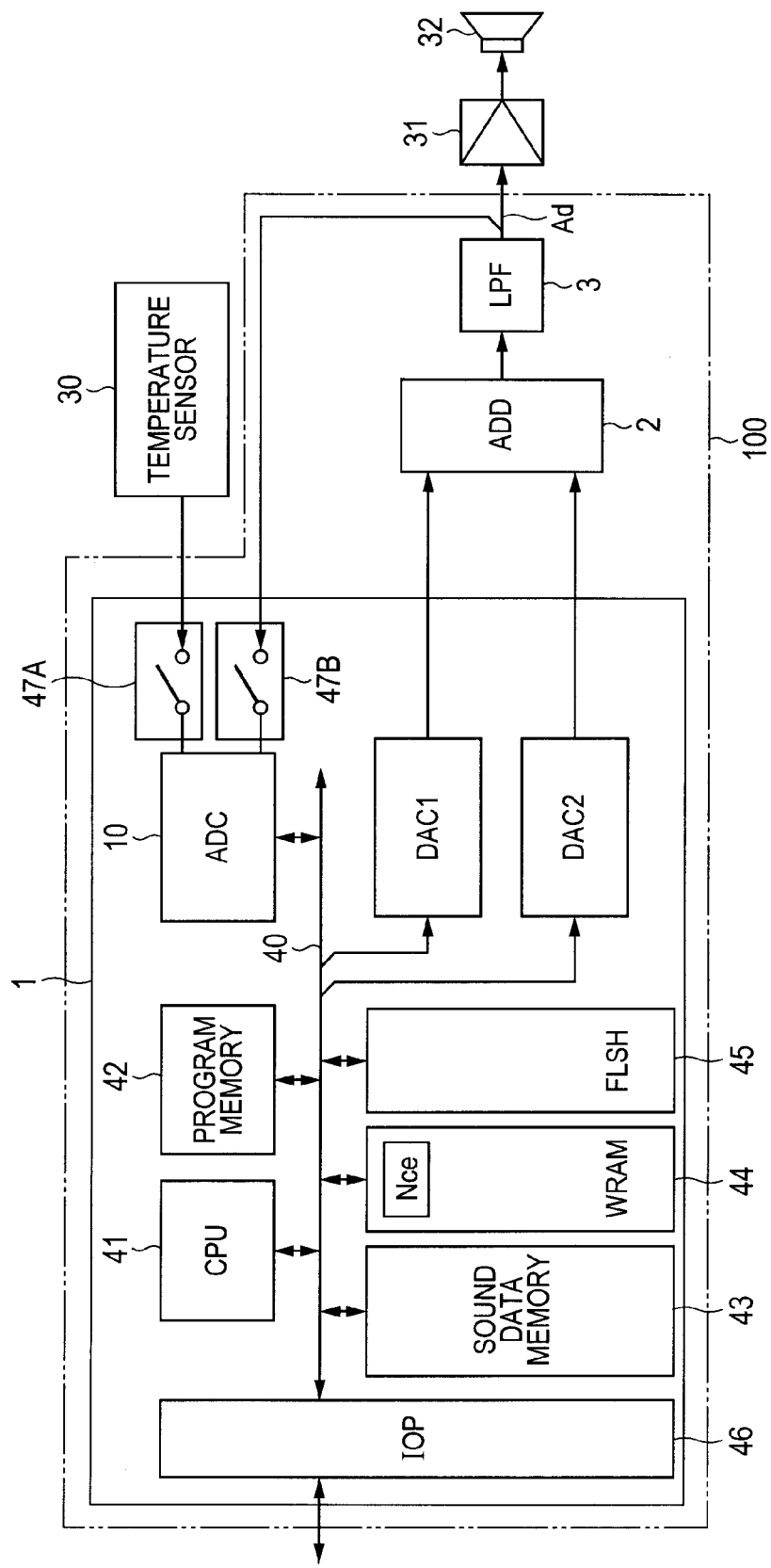
FIG. 6 is a block diagram generally showing a data processing system as an embodiment of the present invention.

FIG. 6 illustrates a data processing system 100 according to a second embodiment of the invention. The data processing system 100 shown in the diagram, although not so limited, performs temperature control according to a result of temperature measurement performed by a temperature sensor 30 and control vocal guidance based on the measurement result.

To the microcomputer 1, in addition to the adder 2 and the low-pass filter 3, a power amplifier 31 amplifying an output signal Ad of the low-pass filter 3 representatively shown and a speaker 32 receiving an output of the power amplifier 31 are coupled.

The microcomputer 1 is, although not limited, formed on a single semiconductor substrate made of single crystal silicon or the like by the known CMOS integrated circuit manufacturing technique or the like. The microcomputer 1 has a central processing unit (CPU) 41 and a program memory 42 storing an operation program of the CPU 41, each coupled as a program control circuit to an internal bus 40. The microcomputer 1 has a work memory (WRAM) 44 of the CPU 41 configured by an SRAM or the like and, in addition, a sound data memory 43 storing PCM data corresponding to various vocal guidances, and an electrically rewritable nonvolatile memory 45 such as a flash memory. The memories 43, 44, and 45 can be accessed by the CPU 41 via the internal bus 40. A not-shown device having an input-output port (IOP) 46 as an external interface circuit and coupled to the input-output port 46 is controlled by the microcomputer 1. The DA converters DAC1 and DAC2 receive digital data from the internal bus 40, convert it to an analog signal, and the analog signal obtained by the conversion is supplied to the adder 2. The AD converter 10 receives a measurement value from the temperature sensor 30 from a first input circuit 47A, and receives an analog signal Ad output from the low-pass filter 3 from a second input circuit 47B.

The CPU 41 controls the calibrating process and the high-precision DA converting process by executing the program in the program memory 42. In the case of obtaining a correction factor Nce with reference to the lookup table in the calibrating process, the lookup table is stored in the flash memory 45, and a memory address for reading the correction factor Nce obtained in the calibrating process from the lookup table is stored in a predetermined region in the flash memory 45. When power-on reset or system reset is cancelled, in the case where the calibrating process is not instructed, the CPU 41 reads the memory address from the parameter region, obtains the correction factor Nce from the lookup table with the read memory address, and sets the correction factor Nce in the WRAM 44. In the high-precision DA converting process, multiplication is executed with the correction factor set in the WRAM 44.

In the case of obtaining the correction factor Nce without using the lookup table in the calibrating process, it is sufficient to store the obtained correction factor in the parameter region in the flash memory 45. When the power-on reset or system reset is cancelled, in the case where the calibrating process is not instructed, the CPU 41 obtains the correction factor Nce from the parameter region and sets it in the WRAM 44. In the high-precision DA converting process, multiplication is executed with the correction factor set in the WRAM 44.

Figure 7:
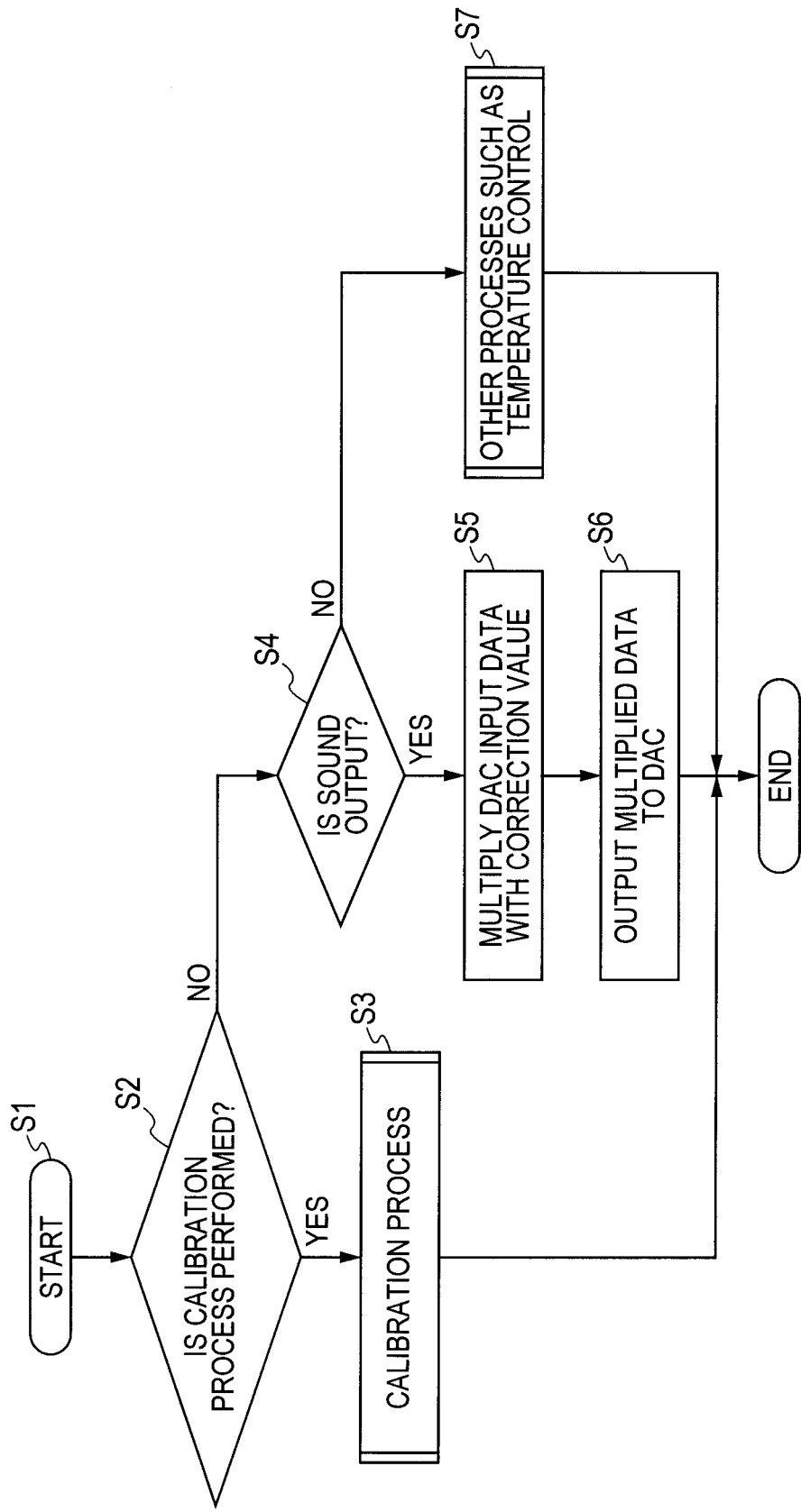
FIG. 7 is a flowchart showing an example of sound process performed by a microcomputer when attention is paid to calibration process and high-precision DA converting process.
Figure 8:
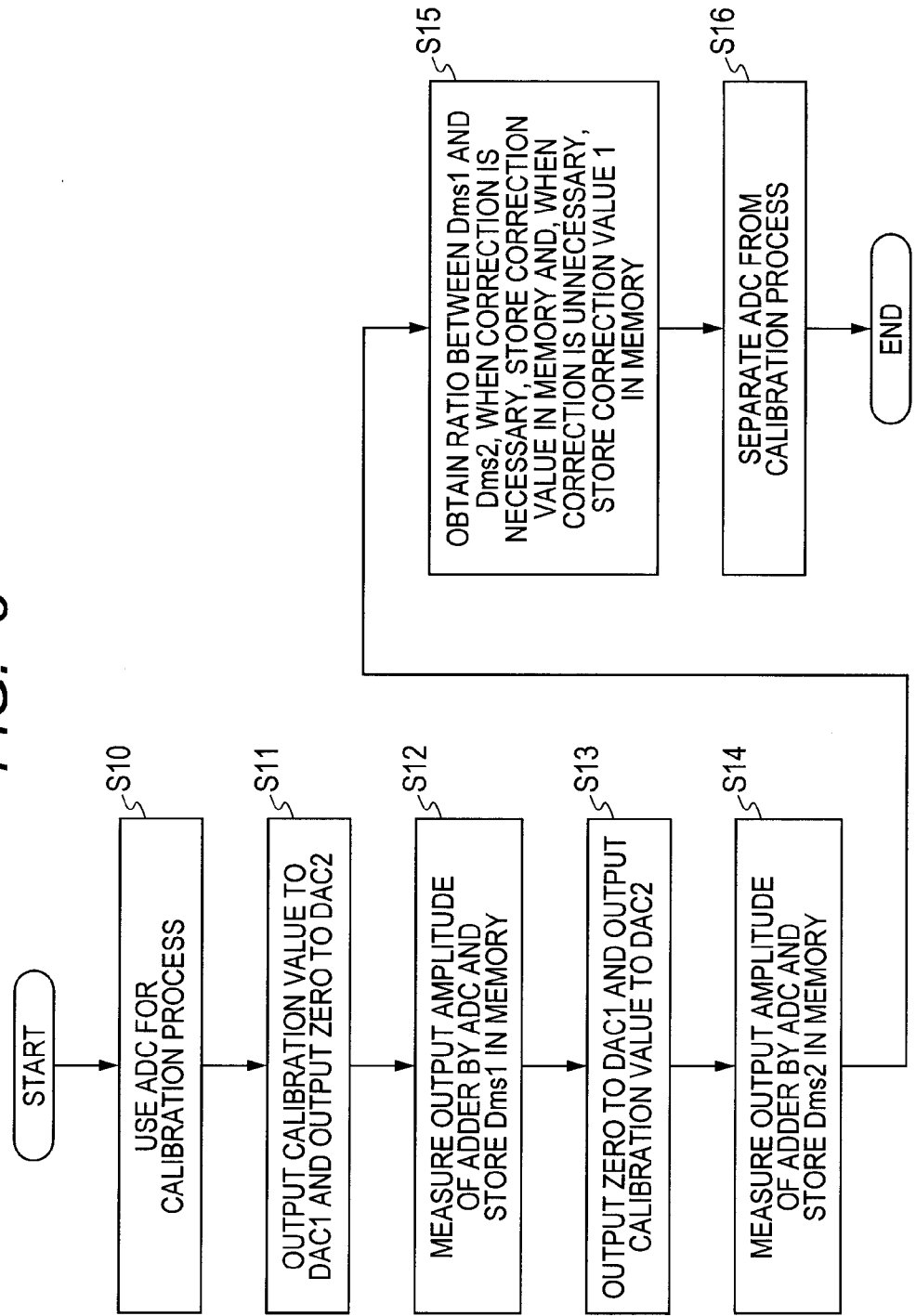
FIG. 8 is a flowchart showing an example of the calibration process.

FIG. 7 shows a flow of sound process performed by the microcomputer 1 when attention is paid to the calibration process and the high-precision DA converting process. FIG. 8 shows a flowchart of the calibration process.

When the power-on reset or system reset is cancelled (S1), the CPU 41 determines whether or not the calibration process is instructed (calibration process mode is set) (S2). In the case where the calibration process mode is set, the calibration process is performed (S3). Instruction of the calibration process, that is, the calibration process mode is designated by a specific state of a mode terminal, the value of mode data held in a specific register, and the like.

When the calibration process mode is set, as shown in FIG. 8, multiplication by the multipliers 4, 5, 6, and 7 is not performed (S10). The calibration value is supplied to the DA converter DAC1 and the value "0" is supplied to the DA converter DAC2 (S11). The values are added by the adder 2, and the first measurement value Dms1 is obtained by using the AD converter 10 which receives an output of the adder 2 and is stored in the WRAM 44 (S12). Subsequently, the program control circuit 12 gives the calibration value Dcb to the DA converter DAC2, gives the value "0" to the DA converter DAC1 (S13), adds the values by the adder 2, obtains the second measurement value Dms2 by using the AD converter 10 which receives an output of the adder 2, and stores it in the WRAM 44 (S14). The CPU determines whether the resistance ratio R1/R2 has an error outside the allowable range on the basis of the ratio between the first measurement value Dms1 and the second measurement value Dms2, for example, obtains a correction factor to reduce the error in accordance with the value of the error outside the allowable range, and stores the correction factor into the parameter region of the flash memory 45. When there is no error outside the allowable range, the CPU stores, for example, the value "1" as the correction factor into the parameter region in the flash memory 45 (S15). After that, the calibration process is finished (S16). As described above, a correction factor may be obtained by using a lookup table. In this case, it is sufficient to store address information for accessing the obtained correction factor from the lookup table into the parameter region in the flash memory 45.

In FIG. 7, when the calibration process mode is not set, whether the sound output operation is instructed or not is determined (S4). When the sound output operation is instructed, data to be DA converted is multiplied with the correction factor (S5), the multiplied data is DA converted and the resultant data is supplied to the adder 2. On the basis of an output of the adder 2, sound is output from the speaker (S6). In the calibration process mode, the correction factor stored in the parameter region in the flash memory 45 is preliminarily and internally transferred to a predetermined region in the WRAM 44 by power-on reset or system reset. The access address information in the lookup table stored in the parameter region in the flash memory 45 is referred to by the power-on reset or system reset, and the correction factor read from the lookup table is preliminarily and internally transferred to a predetermined region in the WRAM 44. Therefore, when the power-on reset or system reset is cancelled, it is sufficient to read the correction factor from the predetermined region in the WRAM 44 and use it in the multiplication of step S5.

In the data processing system 100 of the embodiment, since the DA converters DAC1 and DAC2, the AD converter 10, and the program control circuits (the CPU 10 and the program memory 42) are realized by the circuit modules formed on the microcomputer 1 of one chip, high-precision DA conversion with high resolution can be easily performed by using the plurality of DA converters DAC1 and DAC2 with low resolution in the microcomputer 1.

In the data processing system 100 of the embodiment, in the calibration process, when the resistance ratio R1/R2 of the adder 2 does not have an error outside the allowable range, the value of the correction factor Nce is set to "1". Consequently, it is sufficient to multiply digital data to be converted with the correction factor regardless of the presence or absence of an error outside the allowable range. Regardless of whether the resistance ratio R1/R2 has an error outside the allowable range or not, the process steps (S5 and S6) of correction using the correction factor can be commonly performed in the high-precision AD converting process.

Although not shown in the flowcharts, in the calibration process, a correction flag in which a result of determination of whether the resistance ratio R1/R2 has an error outside the allowable range or not is reflected is held together with the correction factor. In this case, in the high-precision DA converting process, when the correction flag shows that the resistance ratio R1/R2 does not have an error outside the allowable range, it is sufficient to supply a digital signal to be converted to the plurality of DA converters without performing correction with the correction factor Nce. Therefore, in the case where the resistance ratio does not have an error outside the allowable range, a substantially unnecessary correcting process can be omitted in the high-precision AD converting process.

Third Embodiment

Figure 9:
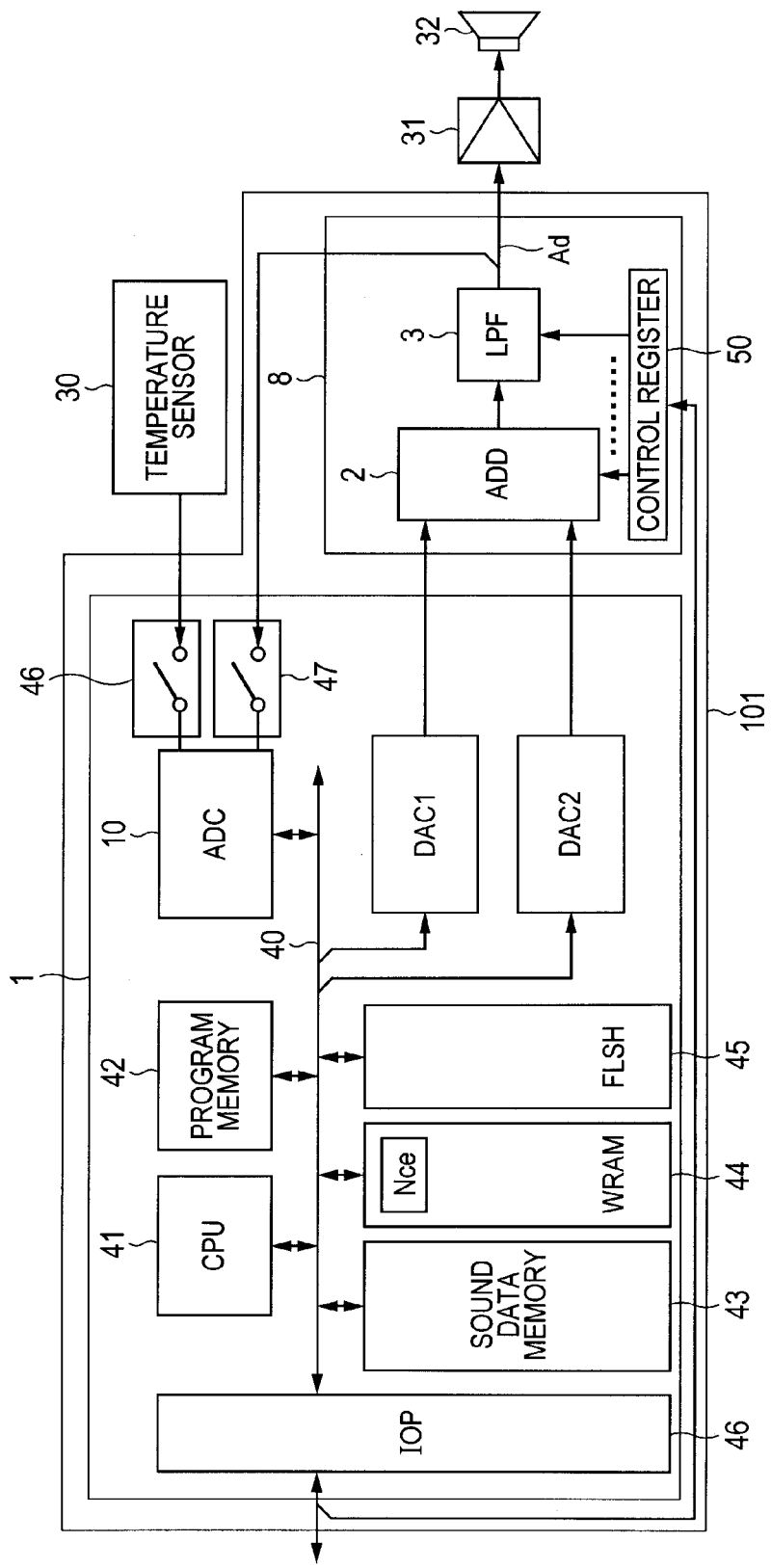
FIG. 9 is a block diagram showing an embodiment of configuring a data processing system employing a reconfigurable analog circuit in a system-in-package form.

FIG. 9 illustrates a data processing system 101 using a reconfigurable analog circuit. The main difference from the data processing system of FIG. 6 is that the adder 2 and the low-pass filter 3 are configured by using a reconfigurable analog circuit 8. The reconfigurable analog circuit 8 is a circuit in which a desired analog circuit function can be reconfigured by control data supplied to a control register 50 via the internal bus 40 under control of the CPU 41. Although not limited, in FIG. 9, the reconfigurable analog circuit 8 is configured as a semiconductor integrated circuit of one chip. The diagram shows a state where a function is set in the form of series connection of the adder 2 and the low-pass filter 3 by control data set in the control register 50. In FIGS. 1-4, the resistive elements 21, 22, and 23 coupled to the amplifier 20 as a component of the adder 2 are external elements. In the third embodiment, the reconfigurable analog circuit 8 and the microcomputer 1 are sealed in a single package to form the data processing system 101 in the system-in-package form. Control data is held in, for example, the nonvolatile storage 45. After cancellation of reset, the CPU 41 initially loads the control data from the nonvolatile storage 45 to the control register 50 via the input/output circuit 46.

Figure 10:
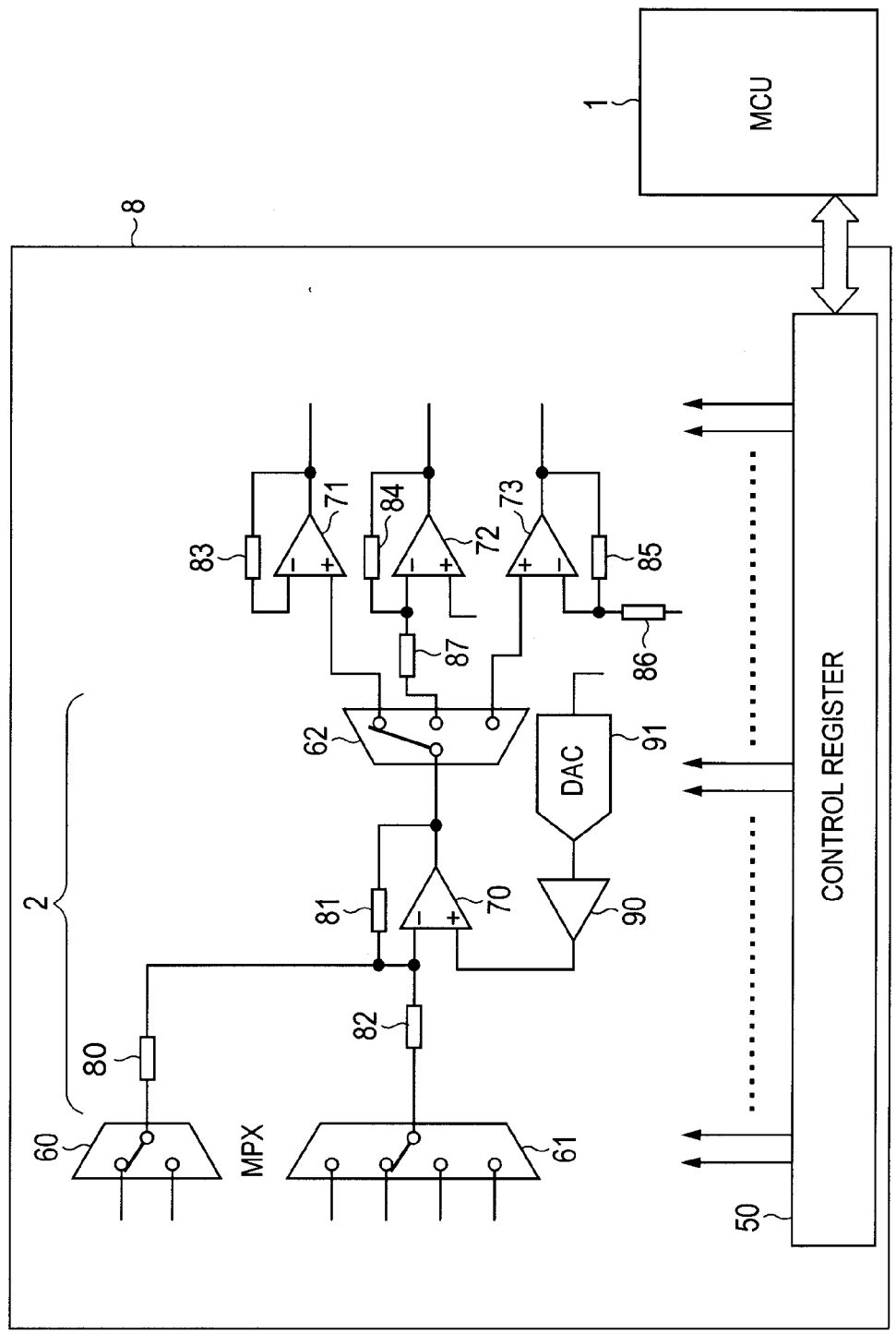
FIG. 10 is a block diagram showing an example of the reconfigurable analog circuit.

FIG. 10 shows a schematic configuration of the reconfigurable analog circuit 8 having an adder 2. In FIG. 10, selectors 60 to 62, amplifiers 70 to 73, external resistive elements 80 to 87, a buffer or voltage follower 90, and a DA converter (DAC) 91 are representatively shown. By control data set in the control register 50 under the direction of the CPU 41, a selection state of the selectors 60 to 62, input of the DAC 91, input of the amplifiers 72 and 73, and the like are determined to set a desired analog circuit function.

For example, the control register 50 can cause a first selector 60 to select from among a plurality of high-order analog output signals input thereto and can cause second selector 61 to select from among a plurality of low-order analog output signals input thereto. The adder 2, under the control of the control register, adds the selected high-order and low-order analog output signals and outputs a combined analog output signal after a predetermined weight has been applied to at least one of the selected low-order analog output signal and the selected high-order analog output signal. In addition, the control register 50 causes the third selector 62 to selectively subject the combined analog output signal to one of the amplifiers 71, 72, 73 to adjust the output voltage and/or the voltage output range, as needed. The control register 50 also sets a resistance value R1 in the resistive elements 80 and 81, sets a resistance value R2 in the resistive element 82, and outputs a reference voltage to the DAC 91 which is then provided to one or more components of the adder 2 via the buffer or voltage follower 90.

Furthermore it is also possible to change the functionality by coupling different components to each input of the first selector 60 and the second selector 61 and change the switching connection the first selector 60, the second selector 61, and the third selector 62. And it is also possible to change the functionality or accuracy in a time divisional manner by switching the first, second and third selector 60-62.

According to the third embodiment, the adder 2 necessary for high-precision DA conversion of high resolution using the DA converters DAC1 and DAC2 of low resolution in the microcomputer 1 can be easily realized by the reconfigurable analog circuit 8. In the reconfigurable analog circuit 8, a number of selection circuits and selection switches such as the selectors 60 to 62 are disposed to make the analog circuit function reconfigurable on the basis of the control data, and a relatively large resistance component is parasitic in the signal path. Such a parasitic resistance component causes an error in the resistance ratio R1/R2 in the adder 2 set by the plurality of resistive elements 80, 81, and 82 (counterparts of resistive elements 21, 22, and 23 of FIGS. 1-4) and exerts an influence. The influence of such an error component can be also reduced by obtaining a correction factor by the calibration process.

Further, even when the reconfigurable analog circuit 8 and the microcomputer 1 are provided in multiple chips, by making them in a system-in-package form, handling of the data processing system becomes easier.

Fourth Embodiment

Figure 11:
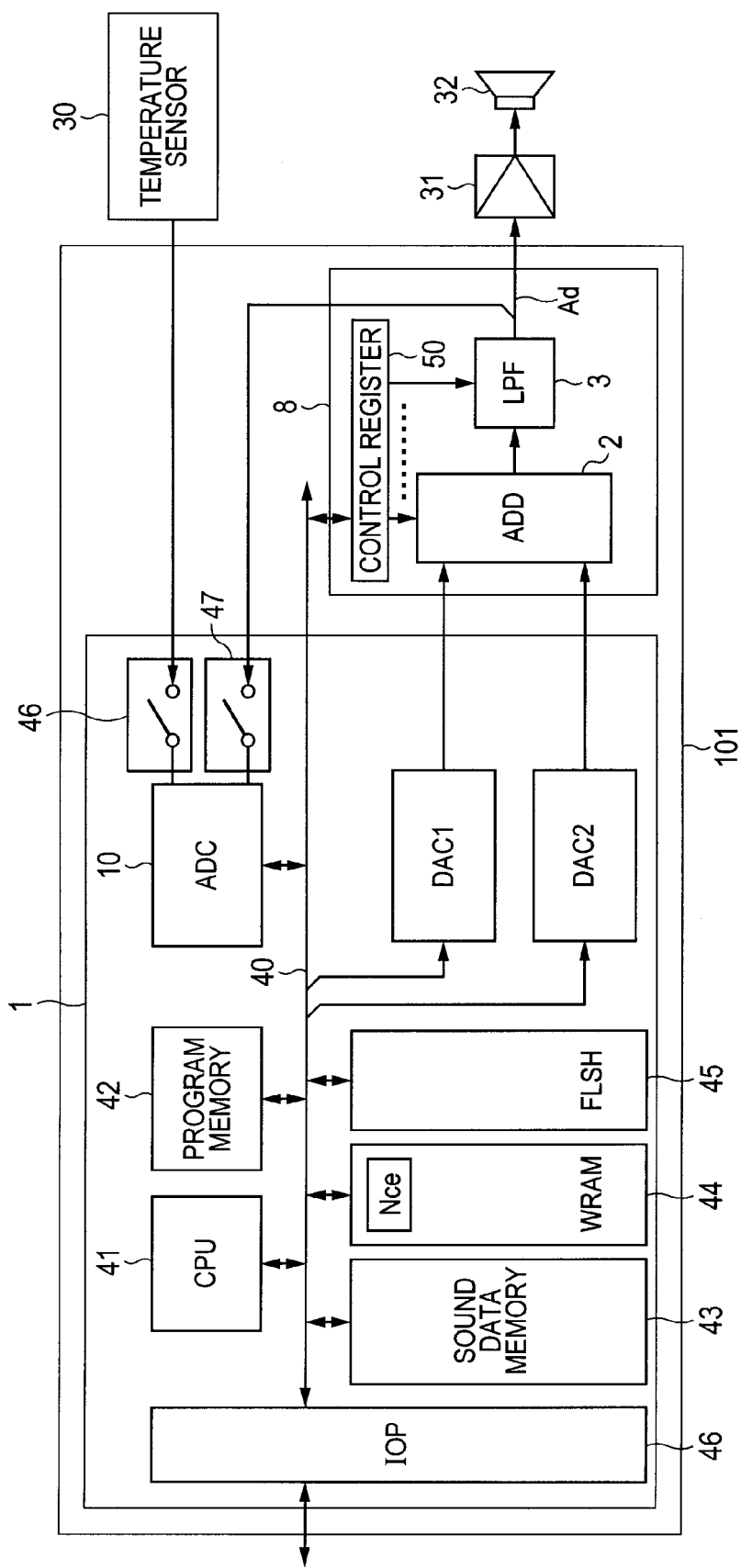
FIG. 11 is a block diagram showing an embodiment of configuring a data processing system employing a reconfigurable analog circuit in one chip.

FIG. 11 illustrates another data processing system 102 using a reconfigurable analog circuit. The main difference from the data processing system 101 of FIG. 9 is that the data processing system 102 is configured in one chip to form a system-on-chip. The data processing system 102 shown in the diagram is, although not limited, formed on a single semiconductor substrate made of single-crystal silicon by the CMOS integrated circuit manufacturing technique. The microcomputer 1 and the reconfigurable analog circuit 8 are configured as internal circuit modules. Resistive elements as components of the adder 2 are mounted on the circuit board on which the data processing system 102 as a single semiconductor integrated circuit is mounted and are coupled to the reconfigurable analog circuit 8. In the control register 50, control data is set via the internal bus 40. The control data is held, for example, in the nonvolatile storage 45 and is initially loaded from the nonvolatile storage 45 to the control register 50 as a part of resetting process.

According to the fourth embodiment, the data processing system 102 is realized in the system-on-chip, and it can contribute to increase in the speed of operation and reduction in power consumption.

Fifth Embodiment

Figure 12:
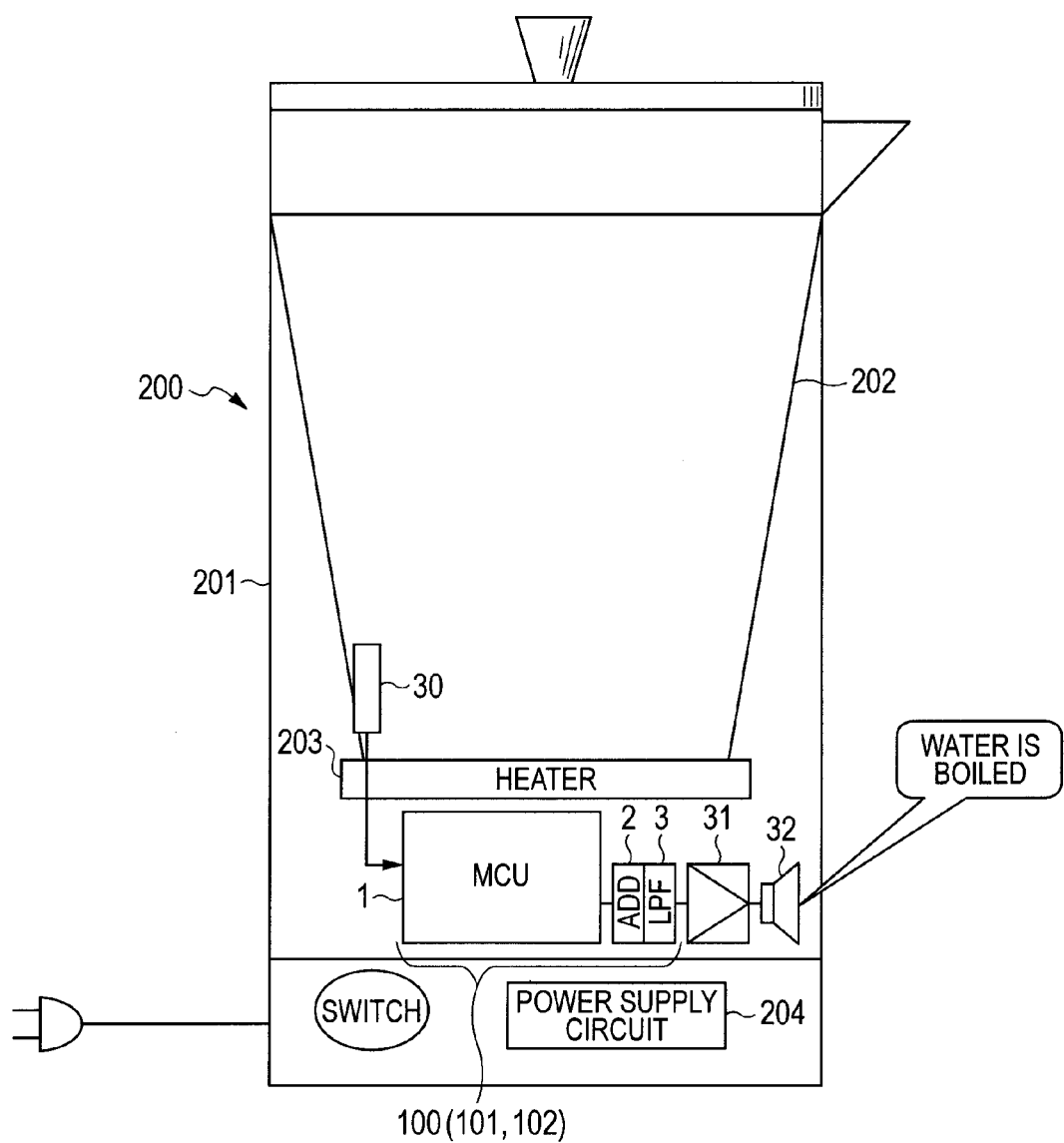
FIG. 12 is an explanatory diagram showing an electric pot to which an embodiment of the invention is applied.

FIG. 12 illustrates a schematic configuration of an electric pot as an electronic device to which the data processing system of the embodiment is applied. An electric pot 200 has a water boiling tank 202 in its body 201 and has a heater 203 at the bottom of the water boiling tank 202. To control overheating by the heater 203 and perform vocal guidance, the data processing system 100, 101, or 102 is employed. A power supply circuit 204 receives a commercial power and generates the operation power of the electric pot. As vocal guidance, for example, "water is boiled" is given when water is boiled, and "water level low" is given when the amount of water becomes small.

By employing the data processing system 100, 101, or 102 in the foregoing embodiments, PCM data having the number of bits larger than the resolution of each of the DA converters (DAC1 and DAC2) provided in the microcomputer 1 is DA converted and a sound signal can be generated. That is, even when a relatively low-cost microcomputer having therein a DA converter whose resolution is eight bits is used, vocal guidance of high sound quality using PCM data of 12 bits can be provided. Therefore, the vocal guidance of high sound quality can be easily realized by a low-cost data processing system.

Although the present invention achieved by the inventors herein has been concretely described on the basis of the embodiments, obviously, the invention is not limited to the embodiments but can be variously changed without departing from the gist.

For example, the number of the DACs is not limited to two. DACs larger than two can be used by hierarchically coupling adders.

The resolution of the DAC is not limited to eight bits, the resolution of the ADC is not limited to 12 bits, and they can be properly changed. The adder using an operational amplifier is not limited to the inverting adder. A non-inverting adder using an operational amplifier or another circuit configuration can be also employed. However, to reduce the number of resistive elements used, a non-inverting adder is preferable.

In the calibration process, the program control circuit can give the value "0" to the first DA converter, give the calibration value to the second DA converter, convert a signal obtained from the adder by the AD converter and, on the basis of the difference between the addition value to the calibration value and $\frac{1}{2}^n$, determine whether the resistance ratio has an error outside the allowable range or not.

For determination of the resistance ratio and computation of the correction factor, an accelerator may be used.

What is claimed is:

1. A data processing system comprising:
a plurality of digital-to-analog ("DA") converters each converting a portion of a digital input signal to a corresponding analog output signal;
an adder configured to add a low-order analog output signal from one of the plurality of DA converters to a high-order analog output signal from another one of the plurality of DA converters and output a combined analog output signal after a predetermined weight has been applied to at least one of the low-order analog output signal and the high-order analog output signal, wherein the low-order analog output signal corresponds to a low-order portion of the digital input signal, the high-order analog output signal corresponds to a high-order portion of the digital input signal, and the predetermined weight is based on a respective relationship between the low-order portion of the digital input signal and the high-order portion of the digital input signal;
an analog-to-digital ("AD") converter that converts the combined analog output signal to a digital feedback signal, the AD converter having a number of bits that is larger than a sum of the number of bits of each of the plurality of DA converters; and
a program control circuit configured to control a calibrating process and a high-precision DA converting process, wherein the calibrating process determines whether an error between the predetermined weight and an actual weight is outside an allowable range, the actual weight based on the digital feedback signal, and when it is determined that the error is outside the allowable range, determines a correction factor for correcting the digital input signal, or portions thereof, so as to reduce influence of the error, and
wherein the high-precision DA converting process corrects the digital input signal, or portions thereof, with the correction factor before being converted by the plurality of DA converters.

2. The data processing system according to claim 1, wherein the plurality of DA converters comprise a first DA converter and a second DA converter,
wherein the first DA converter receives the high-order portion of the digital input signal, the high-order portion corresponding to the n most significant bits of the digital input signal,
wherein the second DA converter receives the low-order portion of the digital input signal, and
wherein the adder has an amplification circuit with a plurality of resistive elements that applies the predetermined weight to at least one of the low-order analog output signal and the high-order analog output signal, the predetermined weight nominally corresponding to $\frac{1}{2}^n$.

3. The data processing system according to claim 2,
wherein the adder is an inverting adder using a differential amplifier,
wherein, to an inversion input terminal of the differential amplifier, an output of the first DA converter is coupled via a resistive element having a first nominal resistance value and an output of the second DA converter is coupled via a resistive element having a second nominal resistance value,
wherein an output terminal of the differential amplifier is feedback-coupled to the inversion input terminal via a resistive element having the first nominal resistance value, and wherein the second nominal resistance value is $2^n$ times as large as the first nominal resistance value.

4. The data processing system according to claim 3, wherein the calibrating process comprises:
a first process that causes a calibration value to be supplied to the first DA converter, that causes a zero value to be supplied to the second DA converter, and that receives, as a first addition value, the corresponding digital feedback signal from the AD converter;
a second process that causes a zero value to be supplied to the first DA converter, that causes a calibration value to be supplied to the second DA converter, and that receives, as a second addition value, the corresponding digital feedback signal from the AD converter; and
a third process that determines whether the difference between the ratio of the second addition value to the first addition value and $½^n$ is outside the allowable range and that obtains a necessary correction factor.

5. The data processing system according to claim 2, wherein the calibrating process sets the correction factor to a value which is larger than 0 and smaller than 1 when the actual weight is greater than $½^n$ and the error is outside the allowable range, and
wherein the high-precision DA converting process applies the correction factor to the low-order portion of the digital input signal.

6. The data processing system according to claim 2, wherein the calibrating process sets the correction factor to a value which is larger than 0 and smaller than 1 when the actual weight is less than $½^n$ and the error is outside the allowable range, and,
wherein the high-precision DA converting process applies the correction factor to the high-order portion of the digital input signal.

7. The data processing system according to claim 2, wherein the calibrating process sets the correction factor to a value greater than 1 when the actual weight is greater than $½^n$ and the error is outside the allowable range, and
wherein the high-precision DA converting process shifts the low-order portion of the digital input signal by one bit toward a low-order direction and applies the correction factor to the shifted low-order portion of the digital input signal.

8. The data processing system according to claim 2, wherein the calibrating process sets the correction factor to a value greater than 1 when the actual weight is greater than $½^n$ and the error is outside the allowable range, and
wherein the high-precision DA converting process increases the number of bits of the high-order portion of the digital input signal by one bit, decreases the number of bits of the low-order portion of the digital input signal by one bit, and applies the correction factor to the low-order portion of the digital input signal.

9. The data processing system according to claim 1, wherein the calibrating process sets "1" as the value of the correction factor when it is determined that the error is within the allowable range.

10. The data processing system according to claim 1, wherein the program control is further configured to maintain a correction flag that reflects whether the error is outside the allowable range, and, wherein the correction flag provides the high-precision DA converting process with an indication of whether to apply the correction factor to the digital input signal.

11. The data processing system according to claim 1, further comprising a nonvolatile storage which can electrically rewrite the correction factor based on control of the program control circuit.

12. The data processing system according to claim 1, wherein the DA converter, the AD converter, and the program control circuit are included in a one-chip microcomputer.

13. The data processing system according to claim 12, wherein the adder includes a reconfigurable analog circuit controlled by control data from the program control circuit, and a plurality of external resistive elements for generating one or more predetermined weights.

14. The data processing system according to claim 13, wherein the reconfigurable analog circuit is configured by a one-chip semiconductor integrated circuit, and the reconfigurable analog circuit and the microcomputer are sealed in a single package in a system-in-package form.

15. The data processing system according to claim 13, wherein the reconfigurable analog circuit and the microcomputer are formed on the same chip.

16. The data processing system according to claim 1, wherein the program control circuit has a central processing unit and a program memory storing a program to be executed by the central processing unit.

17. The data processing system according to claim 16, wherein the digital input signal to be converted is PCM data.

18. A method for converting a digital input signal to an analog output signal using a plurality of digital-to-analog ("DA") converters comprising:
splitting the digital input signal into at least a low-order portion and a high-order portion;
converting the low-order portion of the digital input signal to a low-order analog output signal via a first one of the plurality of DA converters;
converting the high-order portion of the digital input signal to a high-order analog output signal via a second one of the plurality of DA converters;
adding the low-order analog output signal and the high-order analog output signal to obtain the analog output signal, after applying a predetermined weight to at least one of the low-order analog output signal and the high-order analog output signal, the predetermined weight based on a respective relationship between the low-order portion of the digital input signal and the high-order portion of the digital input signal;
converting the analog output signal to a digital feedback signal via an analog-to-digital ("AD") converter having a number of bits that is larger than a sum of the number of bits of each of the plurality of DA converters;
determining a correction factor based on whether an error between the predetermined weight and an actual weight is outside an allowable range, the actual weight based on the digital feedback signal;
applying the correction factor to either the low-order portion of the digital input signal or the high-order portion of the digital input signal when the error is outside the allowable range.

19. The method of claim 18, wherein the high-order portion of the digital input signal corresponds to the n most significant bits of the digital input signal, wherein the low-order portion of the digital input signal corresponds to the m next most significant bits of the digital input signal, and wherein the predetermined weight nominally corresponds to $½^n$.

20. The method of claim 19, wherein determining a correction factor comprises:

supplying a calibration value to the first one of the plurality of DA converters;
supplying a zero value to the second one of the plurality of DA converters;
receiving, as a first addition value, the corresponding digital feedback signal from the AD converter;
supplying a zero value to the first one of the plurality of DA converters;
supplying the calibration value to the second one of the plurality of DA converters;
receiving, as a second addition value, the corresponding digital feedback signal from the AD converter; and
determining the correction factor based on whether the difference between the ratio of the second addition value to the first addition value and $\frac{1}{2}''$ is outside the allowable range.

21. The method of claim 20, wherein determining a corrector factor comprises setting the correction factor between 0 and 1 when the actual weight is greater than $\frac{1}{2}''$ and the error is outside the allowable range, and
wherein applying the correction factor comprises applying the correction factor to the low-order portion of the digital input signal.

22. The method of claim 20, wherein determining a corrector factor comprises setting the correction factor between 0 and 1 when the actual weight is less than $\frac{1}{2}''$ and the error is outside the allowable range, and
wherein applying the correction factor comprises applying the correction factor to the high-order portion of the digital input signal.

23. The method of claim 20, wherein determining a correction factor comprises setting the correction factor to a value greater than 1 when the actual weight is greater than $\frac{1}{2}''$ and the error is outside the allowable range, and
wherein applying the correction factor comprises:
shifting the low-order portion of the digital input signal by one bit toward a low-order direction, and
applying the correction factor to the shifted low-order portion of the digital input signal.

24. The method of claim 20, wherein determining a correction factor comprises setting the correction factor to a value greater than 1 when the actual weight is greater than $\frac{1}{2}''$ and the error is outside the allowable range, and
wherein applying the correction factor comprises:
increases the number of bits of the high-order portion of the digital input signal by one bit,
decreasing the number of bits of the low-order portion of the digital input signal by one bit, and
applying the correction factor to the low-order portion of the digital input signal.

25. The method of claim 18, wherein determining a correction factor comprises setting the correction factor at "1" when the error is within the allowable range.

26. A reconfigurable analog circuit comprising:
a first selector configured to select from among a plurality of high-order analog output signals input thereto;
a second selector configured to select from among a plurality of low-order analog output signals input thereto;
an adder configured to add the high-order analog output signal selected by the first selector to the low-order analog output signal selected by the second selector and output a combined analog output signal after a predetermined weight has been applied to at least one of the low-order analog output signal and the high-order analog output signal;
a third selector configured to selectively subject the combined analog output signal to one of a plurality of amplifiers whereby an amplified combined analog output signal is created; and
a control register configured to control at least the first, second and third selectors and at least one input to at least one of the plurality of amplifiers.

27. The reconfigurable analog circuit according to claim 26, further comprising:
an analog low pass filter configured to receive, as input, the amplified combined analog output signal; and
a digital-to-analog converter receiving digital input from the control register and configured to output a reference voltage to the adder;
wherein the control register is configured to control the digital-to-analog converter.

28. The reconfigurable analog circuit according to claim 27 in combination with a microcontroller configured to supply the control data thereto, wherein:
the reconfigurable analog circuit and is configured by a one-chip semiconductor integrated circuit, and
the reconfigurable analog circuit and the microcomputer are sealed in a single package in a system-in-package form.

29. The reconfigurable analog circuit according to claim 28, wherein the reconfigurable analog circuit and the microcomputer are formed on the same chip.

* * * * *